United States Patent [19]

Subbarao et al.

[11] 4,348,253

[45] Sep. 7, 1982

[54] METHOD FOR FABRICATING VIA HOLES IN A SEMICONDUCTOR WAFER

[75] Inventors: Saligrama N. Subbarao, Plainsboro; Ho-Chung Huang, Princeton Junction, both of N.J.

[73] Assignee: RCA Corporation, New York, N.Y.

[21] Appl. No.: 320,430

[22] Filed: Nov. 12, 1981

[51] Int. Cl.³ ............................................. C23F 1/00
[52] U.S. Cl. ................................... 156/643; 156/150; 156/272.8; 156/344; 156/656; 204/24
[58] Field of Search ................... 204/24, 25; 156/150, 156/151, 252, 253, 272.1, 272.8, 344, 643, 644, 655, 656; 219/121 L, 121 LM; 29/583, 589, 571; 427/97, 88, 89

[56] References Cited

U.S. PATENT DOCUMENTS

| 3,323,198 | 6/1967 | Shortes | 427/88 X |
| 3,562,009 | 2/1971 | Cranston et al. | 117/227 |
| 3,956,052 | 5/1976 | Koste et al. | 427/43.1 X |
| 3,986,196 | 10/1976 | Decker et al. | 357/22 |
| 4,135,988 | 1/1979 | Dugan et al. | 204/15 |
| 4,211,603 | 7/1980 | Reed | 156/659 |

FOREIGN PATENT DOCUMENTS 52-130 4/1977 Japan ......................................... 204/24

Primary Examiner—William A. Powell
Attorney, Agent, or Firm—Birgit E. Morris; Donald S. Cohen; Kenneth R. Glick

[57] ABSTRACT

A circuit pattern is formed on a front side surface of a semiconductor wafer and an apertured photoresist pattern is formed over the circuit pattern. Via holes are then formed by laser irradiating the wafer at sites corresponding to the photoresist apertures. The back side surface of the wafer is next metallized and this surface is adhered to a plating block by means of an adhesive layer. Electrical connection between the substrate and plating block is then made, the via holes are electroplated, and the substrate is separated from the plating block and adhesive layer.

7 Claims, 5 Drawing Figures

METHOD FOR FABRICATING VIA HOLES IN A SEMICONDUCTOR WAFER

The U.S. Government has rights in the subject invention pursuant to Government Contract No. N00014-79-C-0568.

BACKGROUND OF THE INVENTION

The present invention relates to a technique for fabricating electrically conductive paths through a semiconductor wafer. More specifically, the invention discloses a process for forming electroplated via holes through a compound semiconductor substrate.

Conductive via holes are conventionally used as a means for interconnecting regions on one surface of a printed circuit board to regions on the opposing surface of the circuit board. Reference can be made to U.S. Pat. No. 3,799,802, *PLATED THROUGH HOLE PRINTED CIRCUIT BOARDS*, F. W. Schneble, Jr. et al, issued Mar. 26, 1974, for an elaboration of such a process. In the fabrication of semiconductor devices it also, on occasion, becomes desirable to form a circuit pattern on the "front side" of a wafer, a pattern on the "back side" of the wafer, and via hole interconnections between the two patterns. For example, in the fabrication of microwave devices it might be desirable to form a field effect transistor (FET) or diode on a first surface of a compound semiconductor wafer, a microstrip, heat sink, or ground plane on the opposing semiconductor surface, and a via hole interconnection between both sides. An example of this type of structure is described in copending U.S. patent application Ser. No. 192,849, *MONOLITHIC INTEGRATED CIRCUIT*, filed Oct. 1, 1980, by R. L. Camisa.

In the conventional fabrication sequence for a microwave device, various electronic components are first fabricated on the "front side" surface of a III-V material such as gallium arsenide. Photolithographic processing is then performed on the "back side" of the wafer so as to precisely align via hole locations on the back side to circuit features on the front side. A suitable chemical etchant is then applied to the back side, ultimately resulting in a tapered via hole projecting through the wafer. Following the etching, metallization is applied so as to form an electrically conductive connection through the wafer. Further elaboration of a conventional processing sequence is disclosed in U.S. Pat. No. 3,986,196, *THROUGH-SUBSTRATE SOURCE CONTACT FOR MICROWAVE FET*, issued Oct. 12, 1976, to D. R. Decker et al.

There are certain problem areas, however, in conventional conductive via hole processing. The process of aligning a hole pattern on the back side of the wafer to a circuit pattern on the front side of the wafer requires the use of expensive, precision equipment. Additionally, the chemical etching of the via holes produces significant undercutting of wafer material, the extent of the undercutting typically being proportional to the depth of the etched hole. In our experience, attempts to form a 1 mil diameter via hole in a 4 mil thick GaAs wafer, yields a via hole having a 4–5 mil diameter on the back side of the wafer. Furthermore, when there are a plurality of via holes on a particular wafer, the holes typically do not all etch at the same rate, producing a significant variance in dimension among via holes.

In an attempt to overcome the problems associated with chemical etching, we attempted to laser drill the holes directly on the front side wafer surface. However, this technique proved unsatisfactory because of the considerable surface damage the laser drilling introduced to the wafer. In an attempt to overcome these problems, the present invention was discovered.

SUMMARY OF THE INVENTION

In a method for fabricating conductive via holes in a semiconductor wafer a circuit pattern is first defined on a first wafer surface. A layer of apertured photoresist is then formed on the circuit pattern and holes are laser drilled through the wafer at sites corresponding to the photoresist apertures. The second wafer surface, opposing the first surface, is then metallized, and the wafer is placed on a plating block via an adhesive layer. The metallization on the second wafer surface is then electrically connected to the plating block, and the via holes are electroplated. In the final step the semiconductor wafer is separated from the plating block and adhesive layer.

DETAILED DESCRIPTION

Figure 1:
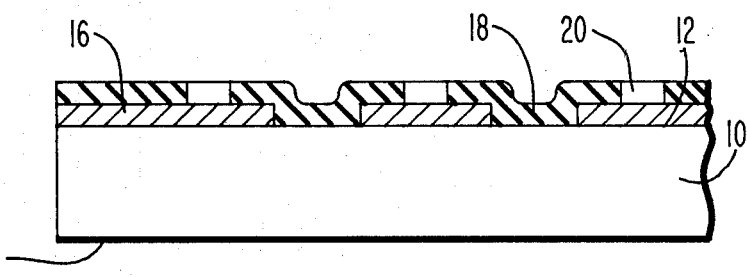
FIGS. 1-5 are sectional views of a semiconductor wafer illustrating the process sequence of the present invention.

Illustrated in FIG. 1 is a substrate 10 having first and second opposing surfaces 12 and 14 which will hereinafter be referred to as the front side and back side respectively. Although the substrate can be of any semiconductor material, in the preferred embodiment it is a compound semiconductor, such as GaAs. Typically, the GaAs substrate will be substantially semi-insulating but will include an active, semiconducting layer adjacent to the front side 12. However, for the sake of clarity in the drawing, no detail of the internal semiconductor structure of the substrate 10 is illustrated.

Disposed on the front side 12 of the substrate 10 is a circuit pattern 16. Typically, the circuit pattern will comprise metallization applied so as to form either Schottky or ohmic contacts on predetermined areas of the surface 12. In practicing the subject invention there are no particular limitations to the configuration of the circuit pattern 16.

An apertured photoresist pattern 18 overlies the circuit pattern 16 and any exposed portions of the front side surface 12. The photoresist pattern 18 can be fabricated in a conventional manner, for example, by spin coating a photoresist layer and then appropriately exposing and developing through a mask so as to form one or more apertures 20. The apertures 20 are located over areas of the circuit pattern 16 to which via hole connection is desired. The photoresist thickness should be approximately 1–2 microns.

Figure 2:
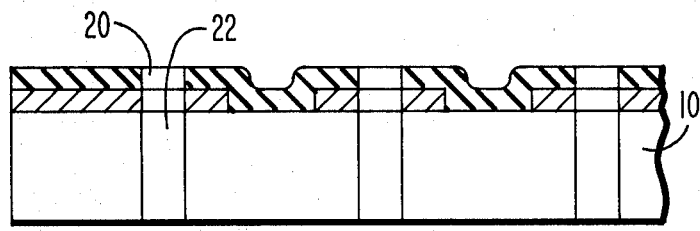

As illustrated in FIG. 2, via holes 22 are then formed by subjecting the substrate 10 to laser irradiation. The substrate is laser irradiated only in those areas corresponding to the apertures 20. When the substrate 10 is 4 mils (100 microns) thick GaAs, a power setting of 20–25 kW on a YAG laser is suitable for drilling a 1 mil (25 microns) hole.

Figure 3:
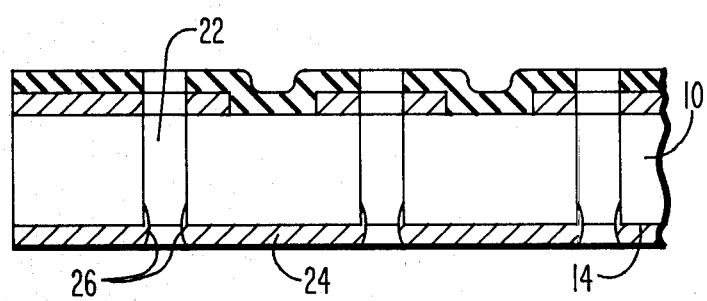

Metallization 24 is then deposited on the back side surface 14 as illustrated in FIG. 3. The metallization can be deposited, for example, by conventional evaporation techniques, and in the preferred embodiment it comprises a 500 Angstrom chromium layer on the surface 14 and a 3000 Angstrom gold layer on the chromium layer.

It should be noted that although evaporation is a substantially directional process, a relatively small amount of metal is deposited inside the lip of each hole 22 on the back side surface 14 as illustrated at 26 in FIG. 3.

Figure 4:
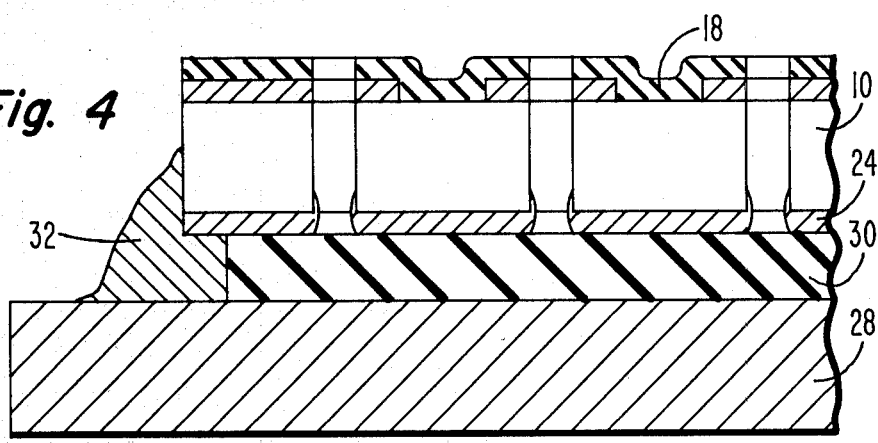

The via holes are then prepared for electroplating as illustrated in FIG. 4. An electrically conducting plating block 28, having an adhesive layer 30 thereon, is provided. The adhesive layer 30 should be electrically insulating, and readily removable when desired. The adhesive layer 30 provides means for temporarily adhering the substrate 10 to the plating block 28. It might comprise, for example, a layer of photoresist. Electrical connection between the back side metallization 24 and plating block 28 is achieved by electrical connection means 32 which might, for example, be silver paint around the periphery of the substrate.

The substrate/plating block is then immersed in a suitable electroplating bath and connected to an appropriate electrical potential such that electroplating initiates in the vicinity of the lip 26 of the back side metallization 24. In the preferred embodiment the electroplated material is gold, and typical plating parameters to achieve a thickness of 4–5 microns are 45 mA/in$^2$ for 30 minutes.

Figure 5:
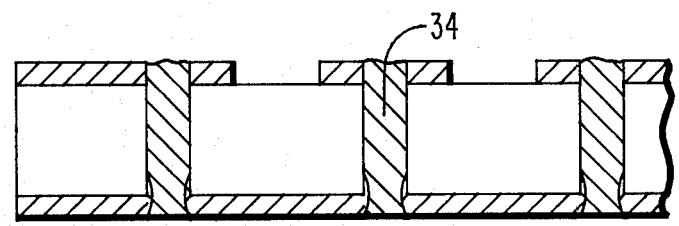

Following the via hole electroplating, the substrate 10 is removed from the plating block 28 by dissolving the adhesive layer 30 and the silver paint connection 32 in a conventional solvent. The photoresist 18 on the front side of the substrate is then conventionally removed, yielding a substrate 10 having plated through via holes 34 therein, as illustrated in FIG. 5.

The present invention thus provides a technique for forming relatively small diameter conductive via holes in a GaAs substrate. The need for front side/back side alignment equipment heretofore used in microwave device fabrication is eliminated. Formation of the via holes by laser drilling rather than chemical etching eliminates undercutting problems as well as hole to hole dimensional variation. The apertured photoresist pattern on the front side surface protects the substrate surface, permitting the laser drilling to be performed on the front side. Furthermore, use of the present invention can permit the use of thicker, easier to handle substrates which are less prone to breakage during device processing. This is because the profile of the laser drilled holes will remain substantially uniform within a reasonably large substrate thickness range. For example, a 10 mil thick substrate might be used throughout device processing. The substrate only need be thinned to its ultimate thickness (e.g. 4 mils) immediately prior to back-side metallization.

What is claimed is:

1. A method for fabricating a conductive via hole in a semiconductor wafer, comprising:
    forming a layer of apertured photoresist on a first wafer surface;
    laser drilling a via hole through said wafer, at a site corresponding to said photoresist aperture;
    metallizing a second wafer surface opposing the first surface;
    placing the second wafer surface on an adhesive layer on a plating block;
    electrically connecting the second surface metallization to the plating block;
    electroplating through the via hole; and
    separating the wafer from the plating block and adhesive layer.

2. A method in accordance with claim 1, wherein the wafer includes a circuit pattern on said first surface.

3. A method in accordance with claim 2, further comprising forming said apertured photoresist layer such that the aperture is located over the circuit pattern.

4. A method in accordance with claim 1, comprising drilling said via hole with a YAG laser.

5. A method in accordance with claim 1, wherein said adhesive layer comprises photoresist.

6. A method in accordance with claim 1, comprising painting an electrically conductive material on the periphery of the wafer so as to electrically connect the wafer to the plating block.

7. A method in accordance with claim 6, wherein the wafer is separated from the plating block by dissolving the adhesive layer and the electrically conductive paint.

* * * * *